United States Patent
Lai et al.

(10) Patent No.: US 11,994,796 B2
(45) Date of Patent: *May 28, 2024

(54) METHOD OF MODELING A MASK HAVING PATTERNS WITH ARBITRARY ANGLES

(71) Applicant: Taiwan Semiconductor Manufacturing Co., Ltd., Hsin-Chu (TW)

(72) Inventors: Chien-Jen Lai, Hsinchu (TW); Xin Zhou, Hsinchu (TW); Danping Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 38 days.

This patent is subject to a terminal disclaimer.

(21) Appl. No.: 17/498,948

(22) Filed: Oct. 12, 2021

(65) Prior Publication Data

US 2022/0026812 A1    Jan. 27, 2022

Related U.S. Application Data

(63) Continuation of application No. 16/656,412, filed on Oct. 17, 2019, now Pat. No. 11,143,955, which is a
(Continued)

(51) Int. Cl.
G06F 30/398    (2020.01)
G03F 1/36    (2012.01)
(Continued)

(52) U.S. Cl.
CPC ............ *G03F 1/70* (2013.01); *G03F 1/36* (2013.01); *G03F 7/70283* (2013.01); *G03F 7/70441* (2013.01); *G03F 7/705* (2013.01)

(58) Field of Classification Search
CPC ........ G03F 7/705; G03F 1/36; G03F 7/70441; G03F 1/70; G03F 7/70283; G03F 1/50;
(Continued)

(56) References Cited

U.S. PATENT DOCUMENTS 6,738,859 B2   5/2004   Liebchen
7,263,683 B1   8/2007   Capodieci
(Continued)

*Primary Examiner* — Binh C Tat
(74) *Attorney, Agent, or Firm* — Haynes and Boone, LLP

(57) ABSTRACT

A mask layout containing a non-Manhattan pattern is received. The received mask layout is processed. An edge of the non-Manhattan pattern is identified. A plurality of two-dimensional kernels is generated based on processed preselected mask layout samples. The two-dimensional kernels each have a respective rotational symmetry. The two-dimensional kernels are applied to the edge of the non-Manhattan pattern to obtain a correction field for the non-Manhattan pattern. A thin mask model is applied to the non-Manhattan pattern. The thin mask model contains a binary modeling of the non-Manhattan pattern. A near field of the non-Manhattan pattern is determined by applying the correction field to the non-Manhattan pattern having the thin mask model applied thereon. An optical model is applied to the near field to obtain an aerial image on a wafer. A resist model is applied to the aerial image to obtain a final resist image on the wafer.

20 Claims, 11 Drawing Sheets

Related U.S. Application Data continuation of application No. 15/666,775, filed on Aug. 2, 2017, now Pat. No. 10,466,586.

(60) Provisional application No. 62/427,286, filed on Nov. 29, 2016.

(51) Int. Cl.
*G03F 1/70* (2012.01)
*G03F 7/00* (2006.01)

(58) Field of Classification Search
CPC .......... G03F 1/76; G03F 7/70091; G03F 1/26; G03F 1/84; G03F 7/70591; G03F 7/70941; G03F 1/44; G03F 7/70433; G03F 7/70291; G03F 7/70416; G03F 7/70625; G03F 1/62; G03F 1/68; G03F 7/70425; G03F 7/70516; G03F 7/70558; G03F 7/70641; G03F 1/00; G03F 1/28; G03F 7/70466; G03F 7/70666; G03F 7/70483; G03F 7/70491; G03F 7/70525; G03F 7/7065; G03F 7/70216; G03F 7/70566; G06F 2111/10; G06F 2119/18; G06F 30/20; G06F 30/30; G06F 30/33; G06F 30/337; G06F 30/39; G06F 30/398; G06F 30/367; G06F 18/23; G06F 18/231; G06F 18/2431; G06F 30/392; G06F 30/00; G06F 17/10; G06F 17/14; G06F 18/00; G06F 17/16; G06F 5/01; G06F 12/1408; G06F 18/213; G06F 18/2413; G06F 18/40; G06F 21/10; G06F 21/109; G06F 21/16; G06F 21/31; G06F 21/33; G06F 21/86; G06F 2211/007; G06F 2221/2101; G06F 2221/2115; G06F 2221/2135; G06F 2221/2151; G06F 3/04842; G06F 40/279; G06F 40/284; G06F 40/30; G06F 9/3001; G06F 9/30018; G06F 9/30032; G06F 9/30036; G06F 9/30141; G06F 17/153; G06F 9/383; G06F 9/448; H01L 22/12; H01L 22/20; H01L 21/0274
USPC ................................................ 716/50–56
See application file for complete search history.

(56) References Cited

U.S. PATENT DOCUMENTS

| | | |
|---|---|---|
| 7,266,480 B2 | 9/2007 | Adam |
| 7,703,069 B1 | 4/2010 | Liu et al. |
| 8,640,060 B2 | 1/2014 | Geshel |
| 8,762,900 B2 | 6/2014 | Shin et al. |
| 8,765,995 B2 | 7/2014 | Chang et al. |
| 8,796,666 B1 | 8/2014 | Huang et al. |
| 8,812,999 B2 | 8/2014 | Liu et al. |
| 8,828,625 B2 | 9/2014 | Lu et al. |
| 8,841,047 B2 | 9/2014 | Yu et al. |
| 8,850,366 B2 | 9/2014 | Liu et al. |
| 8,877,409 B2 | 11/2014 | Hsu et al. |
| 8,906,595 B2 | 12/2014 | Liu et al. |
| 8,918,743 B1 | 12/2014 | Yan et al. |
| 8,954,899 B2 | 2/2015 | Wu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,367,655 B2 | 6/2016 | Shih et al. |
| 9,372,957 B2 * | 6/2016 | Liu .................. G06F 30/20 |
| 9,390,217 B2 | 7/2016 | Wang et al. |
| 9,529,268 B2 | 12/2016 | Chang et al. |
| 9,548,303 B2 | 1/2017 | Lee et al. |
| 10,466,586 B2 * | 11/2019 | Lai ................... G03F 1/36 |
| 11,143,955 B2 * | 10/2021 | Lai ................ G03F 7/70441 |
| 2005/0244728 A1 | 11/2005 | Liu et al. |
| 2007/0209029 A1 | 9/2007 | Ivonin et al. |
| 2010/0175042 A1 * | 7/2010 | Tirapu Azpiroz .. G03F 7/70441 716/55 |
| 2011/0004856 A1 * | 1/2011 | Granik ................. G03F 1/36 716/55 |
| 2011/0176719 A1 | 7/2011 | Inoue et al. |
| 2013/0080982 A1 * | 3/2013 | Word ................... G03F 1/22 716/53 |
| 2013/0283216 A1 | 10/2013 | Pearman et al. |
| 2013/0283217 A1 | 10/2013 | Fujimura et al. |
| 2015/0302132 A1 | 10/2015 | Zhang et al. |
| 2016/0098511 A1 | 4/2016 | Cecil |

* cited by examiner mask pattern · Aerial Image on wafer

METHOD OF MODELING A MASK HAVING PATTERNS WITH ARBITRARY ANGLES

CROSS-REFERENCE TO RELATED APPLICATIONS

This application is a continuation of U.S. patent application Ser. No. 16/656,412, filed on Oct. 17, 2019, which is a continuation of U.S. patent application Ser. No. 15/666,775, filed on Aug. 2, 2017, and entitled "Method of Modeling A Mask Having Patterns With Arbitrary Angles," now U.S. Pat. No. 10,466,586, issued on Nov. 5, 2019, which claims priority to U.S. Provisional Patent Application No. 62/427,286, filed on Nov. 29, 2016, and entitled "Photolithography Mask Model for Patterns with Arbitrary Angles." These disclosures are incorporated herein by reference in their entirety.

BACKGROUND

The semiconductor device industry has experienced rapid growth. In the course of semiconductor device evolution, the functional density has generally increased while feature size has decreased. This scaling down process generally provides benefits by increasing production efficiency and lowering associated costs. Such scaling down has also increased the complexity of design and manufacturing these devices.

One technique applied to the design and manufacturing of semiconductor devices is optical proximity correction (OPC). OPC includes applying features that will alter the photomask design of the layout of the semiconductor device in order to compensate for distortions caused by diffraction of radiation and the chemical process of photo-resist that occur during the use of the lithography tools. Thus, OPC provides for producing circuit patterns on a substrate that more closely conform to a semiconductor device designer's (e.g., integrated circuit (IC) designer) layout for the device. OPC includes all resolution enhancement techniques performed with a reticle or photomask including, for example, adding sub-resolution features to the photomask that interact with the original patterns in the physical design, adding features to the original patterns such as "serifs," adding jogs to features in the original pattern, modifying main feature pattern shapes or edges, and other enhancements. As process nodes shrink, OPC processes and the resultant patterns become more complex.

One type of advanced OPC involves inverse lithography technology (ILT). ILT includes simulating the optical lithography process in the reverse direction, using the desired pattern on the substrate as an input to the simulations. The ILT process may produce complex, curvilinear patterns on a photomask or reticle, rather than the Manhattan patterns that are formed on conventional photomasks or reticles. Unfortunately, conventional ILT photomasks and the methods of fabrication thereof still face various difficulties with respect to the non-Manhattan patterns.

Therefore, although existing ILT photomasks have been generally adequate for their intended purposes, they have not been entirely satisfactory in all respects, in particular the missing of an accurate mask model capable of dealing with non-Manhattan patterns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
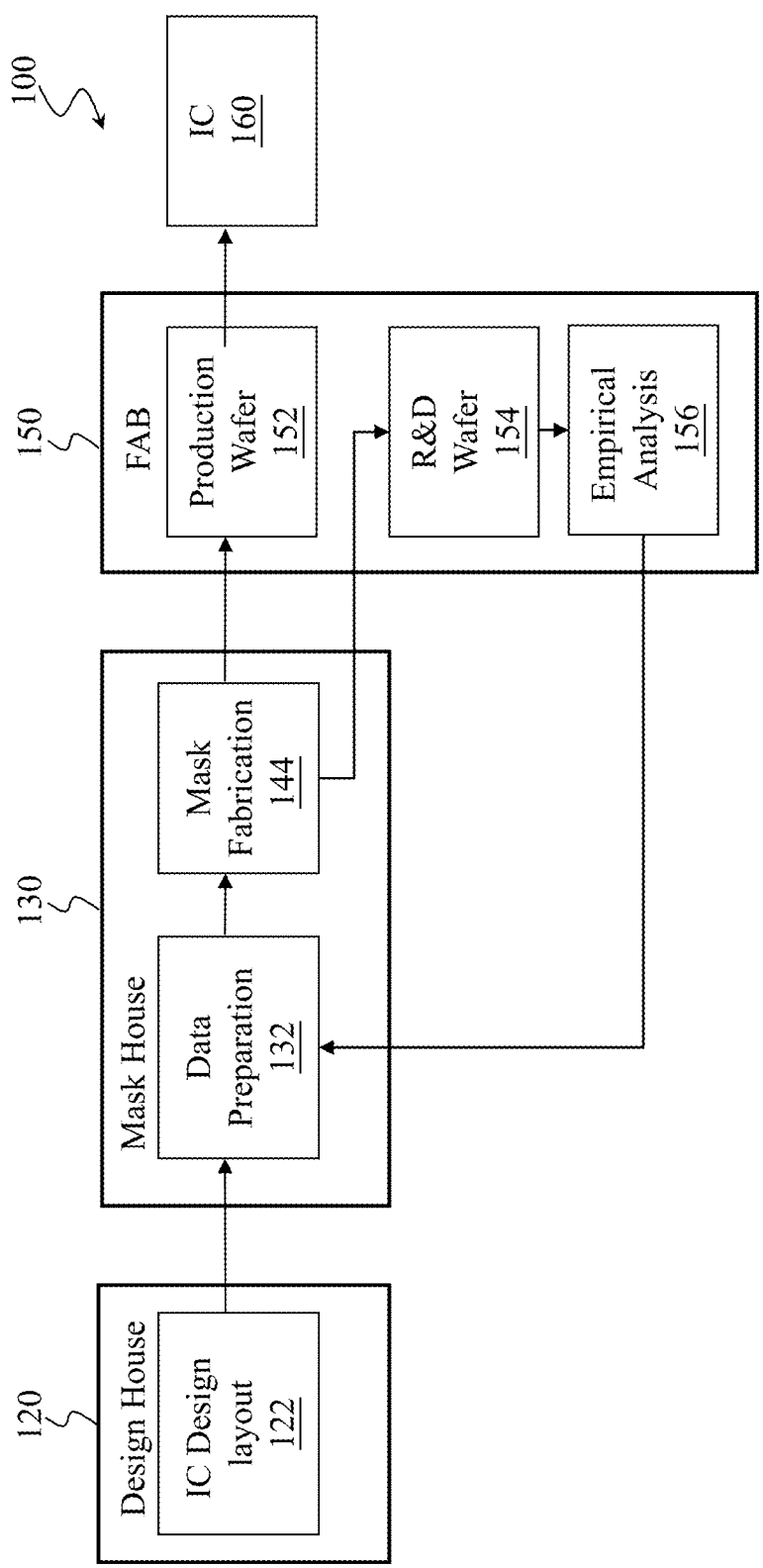
FIG. 1 is a simplified block diagram of an embodiment of an integrated circuit (IC) manufacturing system according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor fabrication progresses to increasingly small technology nodes, various techniques are employed to help achieve the small device sizes. One example of such technique is inverse lithography technology (ILT). In more detail, conventional lithography masks typically use Manhattan patterns for IC features, which include polygons with straight edges (e.g., rectangles, squares, etc.). In older semiconductor technology nodes, the IC features fabricated on a wafer (using the conventional lithography masks) can reasonably approximate the Manhattan patterns on the lithography masks. However, as device size scaling down continues, the geometries on the lithography mask may deviate significantly from the actually-fabricated IC features and their respective Manhattan patterns on the wafer. While the deviation may enhance the process window of fabrication, it also creates modeling challenges.

ILT resolves the above problem by treating optical proximity correction (OPC) as an inverse imaging problem and computes a lithography mask pattern using an entire area of a design pattern rather than just edges of the design pattern. While ILT may in some cases produce unintuitive mask patterns (such as freeform or arbitrary-shaped patterns that do not have straight or linear edges), ILT may be used to fabricate masks having high fidelity and/or substantially improved depth-of-focus and exposure latitude, thereby enabling printing of features (i.e., geometric patterns) that may otherwise have been unattainable.

However, ILT may present other challenges as well. For example, conventional techniques of modeling lithography masks are optimized for Manhattan patterns. In other words, these conventional lithography mask modeling techniques assume the patterns on the lithography mask only have straight or linear edges. Since ILT uses lithography masks with patterns that have non-straight or curvilinear edges (e.g., patterns having arbitrary angles), conventional mask lithography modeling does not work well for ILT masks.

The present disclosure overcomes the problem discussed above by generating two-dimensional kernels that can be rotated fast in order to accurately model an ILT lithography mask having the freeform or arbitrary mask patterns. The various aspects of the present disclosure are discussed in more detail below with reference to FIGS. 1-11.

FIG. 1 is a simplified block diagram of an embodiment of an integrated circuit (IC) manufacturing system 100 and an IC manufacturing flow associated therewith, which may benefit from various aspects of the present disclosure. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may have a common owner, and may even coexist in a common facility and use common resources.

In various embodiments, the design house 120, which may include one or more design teams, generates an IC design layout 122. The IC design layout 122 may include various geometrical patterns designed for the fabrication of the IC device 160. By way of example, the geometrical patterns may correspond to patterns of metal, oxide, or semiconductor layers that make up the various components of the IC device 160 to be fabricated. The various layers combine to form various features of the IC device 160. For example, various portions of the IC design layout 122 may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. In various examples, the design house 120 implements a design procedure to form the IC design layout 122. The design procedure may include logic design, physical design, and/or place and route. The IC design layout 122 may be presented in one or more data files having information related to the geometrical patterns which are to be used for fabrication of the IC device 160. In some examples, the IC design layout 122 may be expressed in a GDSII file format or DFII file format.

In some embodiments, the design house 120 may transmit the IC design layout 122 to the mask house 130, for example, via the network connection described above. The mask house 130 may then use the IC design layout 122 to manufacture one or more masks to be used for fabrication of the various layers of the IC device 160 according to the IC design layout 122. In various examples, the mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the example of FIG. 1, the mask data preparation 132 and mask fabrication 144 are illustrated as separate elements; however, in some embodiments, the mask data preparation 132 and mask fabrication 144 may be collectively referred to as mask data preparation.

In some examples, the mask data preparation 132 includes application of one or more resolution enhancement technologies (RETs) to compensate for potential lithography errors, such as those that can arise from diffraction, interference, or other process effects. In some examples, optical proximity correction (OPC) may be used to adjust line widths depending on the density of surrounding geometries, add "dog-bone" end-caps to the end of lines to prevent line end shortening, correct for electron beam (e-beam) proximity effects, or for other purposes as known in the art. For example, OPC techniques may add sub-resolution assist features (SRAFs), which for example may include adding scattering bars, serifs, and/or hammerheads to the IC design layout 122 according to optical models or rules such that, after a lithography process, a final pattern on a wafer is improved with enhanced resolution and precision. The mask data preparation 132 may also include further RETs, such as off-axis illumination (OAI), phase-shifting masks (PSM), other suitable techniques, or combinations thereof.

One technique that may be used in conjunction with OPC is inverse lithography technology (ILT), which treats OPC as an inverse imaging problem and computes a mask pattern using an entire area of a design pattern rather than just edges of the design pattern. While ILT may in some cases produce unintuitive mask patterns, ILT may be used to fabricate masks having high fidelity and/or substantially improved depth-of-focus and exposure latitude, thereby enabling printing of features (i.e., geometric patterns) that may otherwise have been unattainable. In some embodiments, an ILT process may be more generally referred to as a model-based (MB) mask correction process. To be sure, in some examples, other RET techniques such as those described above and which may use a model, for example, to calculate SRAF shapes, etc. may also fall within the scope of a MB mask correction process.

The mask data preparation 132 may further include a mask rule checker (MRC) that checks the IC design layout that has undergone one or more RET processes (e.g., OPC, ILT, etc.) with a set of mask creation rules which may contain certain geometric and connectivity restrictions to ensure sufficient margins, to account for variability in semiconductor manufacturing processes, etc. In some cases, the MRC modifies the IC design layout to compensate for limitations which may be encountered during mask fabrication 144, which may modify part of the modifications performed by the one or more RET processes in order to meet mask creation rules.

In some embodiments, the mask data preparation 132 may further include lithography process checking (LPC) that simulates processing that will be implemented by the IC manufacturer 150 to fabricate the IC device 160. The LPC may simulate this processing based on the IC design layout 122 to create a simulated manufactured device, such as the IC device 160. The processing parameters in LPC simulation may include parameters associated with various processes of the IC manufacturing cycle, parameters associated with tools used for manufacturing the IC, and/or other aspects of the manufacturing process. By way of example, LPC may take into account various factors, such as aerial image contrast, depth of focus ("DOF"), mask error enhancement factor ("MEEF"), other suitable factors, or combinations thereof. The simulated processing (e.g., implemented by the LPC) can be used to provide for the generation of a process-aware rule table (e.g., for SRAF insertions). Thus, an SRAF rule table may be generated for the specific IC design layout 122, with consideration of the processing conditions of the IC manufacturer 150.

In some embodiments, after a simulated manufactured device has been created by LPC, if the simulated device layout is not close enough in shape to satisfy design rules, certain steps in the mask data preparation 132, such as OPC and MRC, may be repeated to refine the IC design layout 122 further. In such cases, the previously generated SRAF rule table may also be updated.

It should be understood that the above description of the mask data preparation 132 has been simplified for the purposes of clarity, and data preparation may include additional features such as a logic operation (LOP) to modify the IC design layout according to manufacturing rules. Additionally, the processes applied to the IC design layout 122 during data preparation 132 may be executed in a variety of different orders.

After mask data preparation 132 and during mask fabrication 144, a mask or a group of masks may be fabricated based on the modified IC design layout. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 150, such as a semiconductor foundry, uses the mask (or masks) fabricated by the mask house 130 to transfer one or more mask patterns onto a production wafer 152 and thus fabricate the IC device 160 on the production wafer 152. The IC manufacturer 150 may include an IC fabrication facility that may include a myriad of manufacturing facilities for the fabrication of a variety of different IC products. For example, the IC manufacturer 150 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business.

In various embodiments, the semiconductor wafer (i.e., the production wafer 152) within and/or upon which the IC device 160 is fabricated may include a silicon substrate or other substrate having material layers formed thereon. Other substrate materials may include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor wafer may further include various doped regions, dielectric features, and multilevel interconnects (formed at subsequent manufacturing steps). Moreover, the mask (or masks) may be used in a variety of processes. For example, the mask (or masks) may be used in an ion implantation process to form various doped regions in the semiconductor wafer, in an etching process to form various etching regions in the semiconductor wafer, and/or in other suitable processes.

It is understood that the IC manufacturer 150 may use the mask (or masks) fabricated by the mask house 130 to transfer one or more mask patterns onto a research and development (R&D) wafer 154. One or more photolithography processes may be performed on the R&D wafer 154. After photolithography processing of the R&D wafer 154, the R&D wafer 154 may then be transferred to a test lab (e.g., metrology lab or parametric test lab) for empirical analysis 156. Empirical data from the R&D wafer 154 may be collected and then transferred to the mask house 130 to facilitate the data preparation 132.

Figure 2:
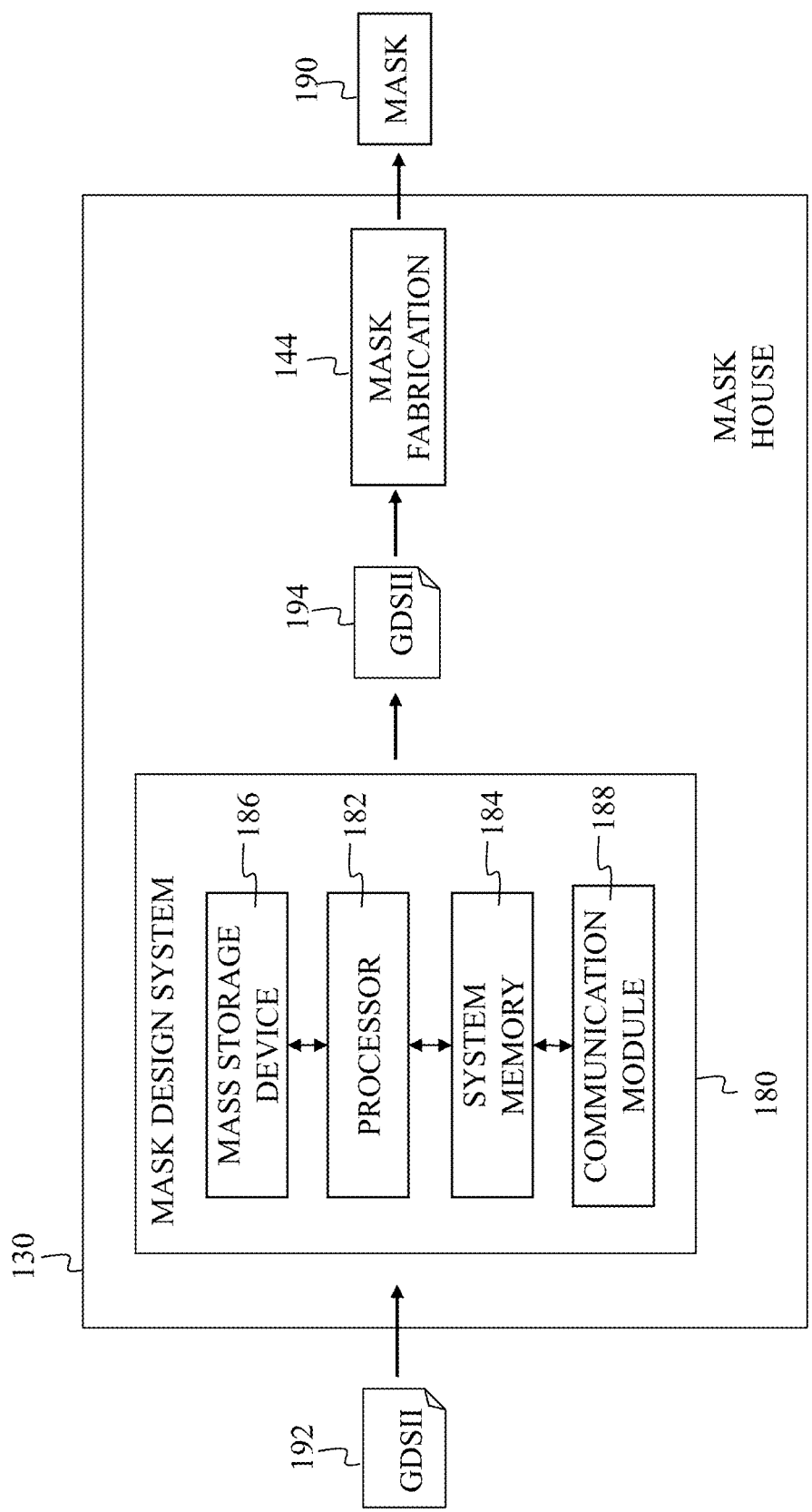
FIG. 2 is a detailed block diagram of the mask house according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 180 that is operable to perform the functionality described in association with mask data preparation 132 of FIG. 1. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 186. Examples of mass storage devices may include hard discs, optical disks, magneto-optical discs, solid-state storage devices, and/or a variety other mass storage devices. The communication module 188 is operable to communicate information such as IC design layout files with the other components in the IC manufacturing system 100, such as design house 120. Examples of communication modules may include Ethernet cards, 802.11 WiFi devices, cellular data radios, and/or other suitable devices.

In operation, the mask design system 180 is configured to manipulate the IC design layout 122 according to a variety of design rules and limitations before it is transferred to a mask 190 by mask fabrication 144. For example, in an embodiment, mask data preparation 132, including OPC, ILT, MRC, and/or LPC, may be implemented as software instructions executing on the mask design system 180. In such an embodiment, the mask design system 180 receives a first GDSII file 192 containing the IC design layout 122 from the design house 120. After the mask data preparation 132 is complete, the mask design system 180 transmits a second GDSII file 194 containing a modified IC design layout to mask fabrication 144. In alternative embodiments, the IC design layout may be transmitted between the components in IC manufacturing system 100 in alternate file formats such as DFII, CIF, OASIS, or any other suitable file type. Further, the mask design system 180 and the mask house 130 may include additional and/or different components in alternative embodiments.

In lithography, the near field of a binary mask pattern resembles the mask pattern but has blurred pattern edge. Therefore, it can be approximated by the thin mask model that assigns two different constant field values to areas occupied or not occupied by patterns respectively. To improve the accuracy of the near field model, a correction unit—also referred to as a kernel—needs to be determined. Once determined, the kernel is applied along the (sharp) edge of the mask pattern to generate a correction field that will be added to the thin mask field. This will generate a field with a blurred edge that closely resembles the true near field of the mask.

Figure 3:
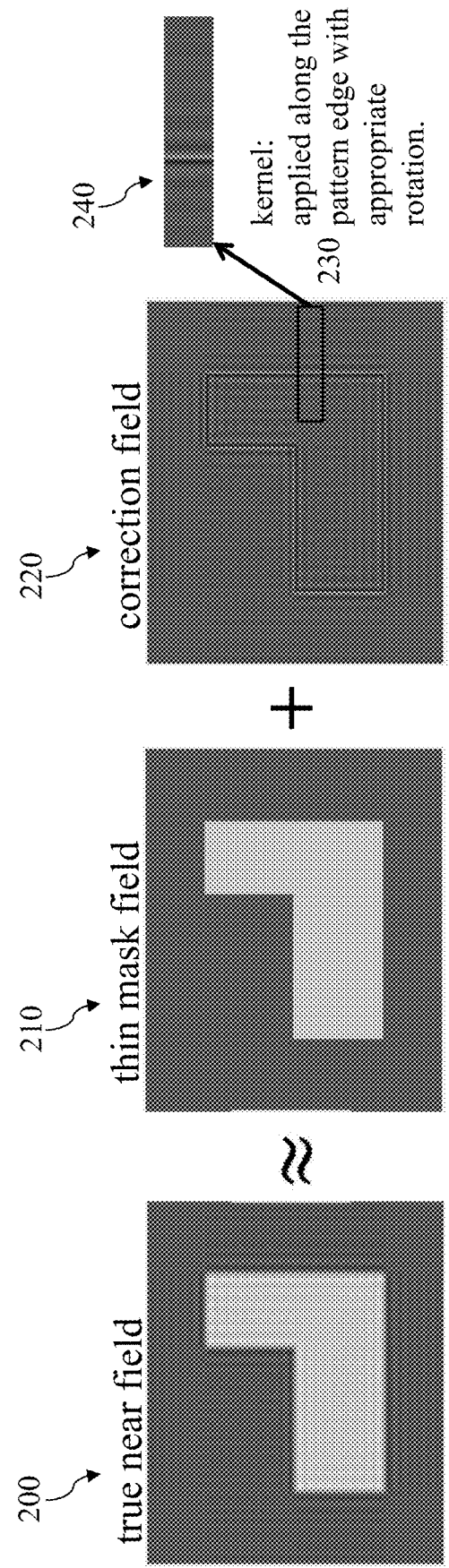
FIG. 3 is a graphical illustration of how a near field of a mask is generated according to various aspects of the present disclosure.

FIG. 3 is a graphical illustration of how a near field of a mask is generated using the above process (i.e., by applying a kernel-containing-correction-field to a thin mask field). For example, the true near field 200 of a polygonal mask pattern is shown in FIG. 3. As can be seen in FIG. 3, the true near field 200 has blurred edges. The true near field 200 can be approximated by combining a thin mask field 210 with a correction field 220. The thin mask field 210 has sharp edges (i.e., not blurry). The correction field 220 includes kernels 230, some examples of which are illustrated in a magnified window 240 in FIG. 3. An accurate kernel is indispensable for the accurate simulation of the true near field of any mask pattern.

Note that the kernel 230 in FIG. 3 is a one-dimensional kernel that only varies along one dimension and is uniform along the other dimension. A one-dimensional kernel works fine for Manhattan patterns such as the pattern shown in FIG. 3. However, for non-Manhattan patterns, for example curved patterns or patterns with arbitrary angles that are used in ILT, the one-dimensional kernels may be insufficient to generate an accurate correction field, and as such it may be difficult to use the one-dimensional kernels to generate an accurate near field. To overcome this problem, the present disclosure uses two-dimensional kernels that can be quickly rotated. These two-dimensional kernels are used to generate the correction field, which is then applied to the thin mask field to generate an accurate near field for the non-Manhattan patterns used in ILT, as discussed below in more detail.

Figure 4:
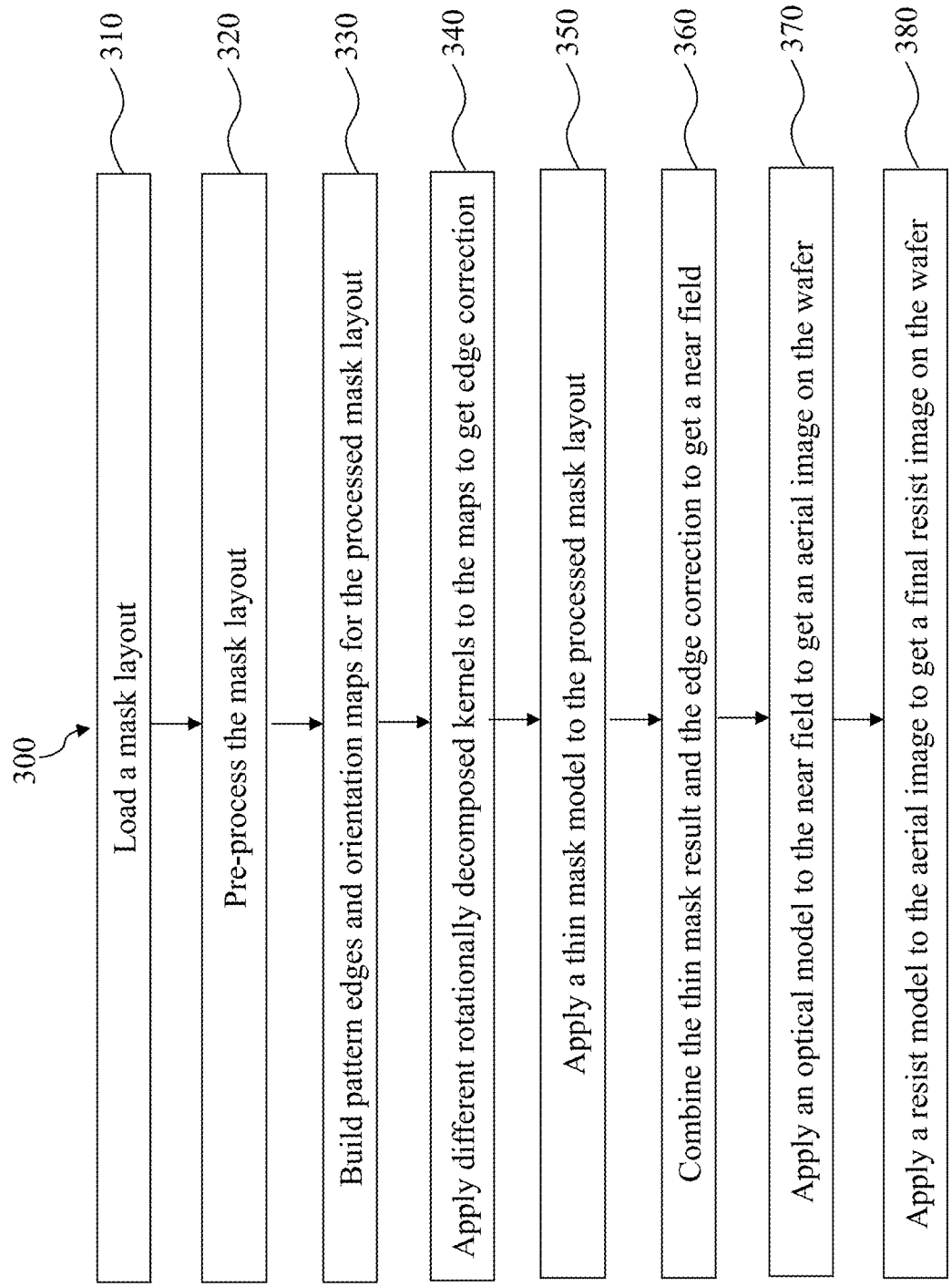
FIG. 4 is a flowchart of a method illustrating a process flow according to various aspects of the present disclosure.

FIG. 4 is a flowchart of a method 300 that illustrates an overall flow of an embodiment of the present disclosure.

The method 300 includes a step 310, in which a mask layout is loaded. The mask layout may be for an ILT mask, which as discussed above may contain non-Manhattan shapes that are optimized for certain IC patterns. For example, the mask layout loaded herein may include curvilinear pattern edges.

The method 300 includes a step 320, in which the mask layout loaded in step 310 undergoes pre-processing. In some embodiments, the pre-processing may include steps such as rasterization and/or anti-aliasing filtering. Rasterization refers to the task of taking an image described in a vector graphics format (e.g., including the polygonal shapes of the mask patterns) and converting it into a raster image that comprises pixels or dots. In this process, a high resolution result may be obtained. However, such a high resolution may not be needed, and thus the high resolution may be down-converted to a lower resolution. This down-conversion process may involve signal processing that could result in aliasing. For high frequency aliasing components that are not of interest, they may be filtered out by the anti-aliasing filtering step.

The method 300 includes a step 330, in which an edge distribution and orientation maps of the non-Manhattan patterns are built for the mask layout that is processed in step 320. The details of step 330 will be discussed in greater detail below.

The method 300 includes a step 340, in which different rotationally decomposed kernels (e.g., two-dimensional kernels) are applied to the edge and orientation maps to get edge correction (for the non-Manhattan patterns). In other words, the step 340 obtains the correction field similar to the correction field 220 shown in FIG. 3, though the correction field herein uses two-dimensional kernels. The details of step 340 will also be discussed in greater detail below.

The method 300 includes a step 350, in which a thin mask model is applied to the processed mask layout obtained in step 330. As discussed above, the thin mask model contains binary modeling of the patterns on the mask. In other words, the thin mask model describes the mask patterns as having sharp edges (e.g., black and white). When the thin mask model is applied to the processed mask layout, a thin mask field (e.g., the thin mask field 210 in FIG. 3) may be obtained as a result. Of course, since the present disclosure may use non-Manhattan patterns on the mask, the thin mask field obtained herein may also have non-Manhattan shapes.

The method 300 includes a step 360, in which the thin mask result (obtained in step 350) and the edge correction (obtained in steps 340) are combined to obtain a near field. Again, the edge correction may be viewed as the correction field similar to the correction field in FIG. 3 (though with two-dimensional kernels). The kernels of the correction field may be applied along the edge of the mask pattern to generate the correction field that adds a blurred edge to the thin mask field to approximate the true near field of the mask patterns.

The method 300 includes a step 370, in which an optical model is applied to the near field (obtained in step 360) to obtain an aerial image on the wafer. The step 370 may also be viewed as performing an exposure simulation.

The method 300 includes a step 380, in which a photoresist model is applied to the aerial image to obtain a final photoresist image on the wafer. The step 380 may also be viewed as performing a photoresist simulation.

The steps 330 and 340 are now discussed in more detail with reference to FIG. 5, which is a graphical illustration of an example non-Manhattan pattern 400 and a plurality of example two-dimensional kernels 411-416 for the non-Manhattan pattern 400. The non-Manhattan pattern 400 is displayed in a grid of pixels, where each pixel has an X-axis dimension Δx and a Y-axis dimension Δy. In some embodiments, Δx and Δy are each in a range from 1 nanometer (nm) to 32 nm. The non-Manhattan pattern 400 contains curvilinear edges. The non-Manhattan pattern 400 may also be said to have arbitrary angles (rather than angles of 0, 90, 180, and 270 degrees, as would have been the case with Manhattan patterns). It is understood that since the pattern 400 does not have distinctly separate edge segments, it may be considered to have a single continuous edge as well, where the edge is composed of a plurality of points that each have a two-dimensional kernel associated therewith.

The pixels on which the edge(s) of the non-Manhattan pattern 400 is located are referred to as edge pixels. A gradient (or a gradient magnitude) of the pattern may be taken in order to identify these edge pixels. Depending on the gradient method and the anti-aliasing filter applied, the edges may be several-pixel wide. The edge pixels are displayed in FIG. 5 with visual emphasis. Each of these edge pixels contains a segment of the edge of the non-Manhattan pattern 400. The orientation of the segment of the edge in each pixel may be determined by taking the normal line (also referred to as the normal vector) of that edge segment. A normal line/vector to a surface refers to a line/vector that is perpendicular or orthogonal to that surface. Thus, the normal line/vector associated with any edge pixel is the line/vector that is perpendicular or orthogonal to the segment of the edge in that particular pixel.

After the edge pixels have been identified (e.g., by taking the gradient), and the orientation of the edge segment in each pixel has been determined (e.g., by determining the normal line/vector), a two-dimension kernel is applied to the respective edge segment in each pixel. The two dimensional kernels may each have their own orientation angle, which is the orientation of the edge segment of the corresponding pixel. In other words, the two-dimensional kernels are rotated differently along the edge of the non-Manhattan pattern 400, each as a function of the orientation of the corresponding edge of the non-Manhattan pattern 400.

Figure 5:
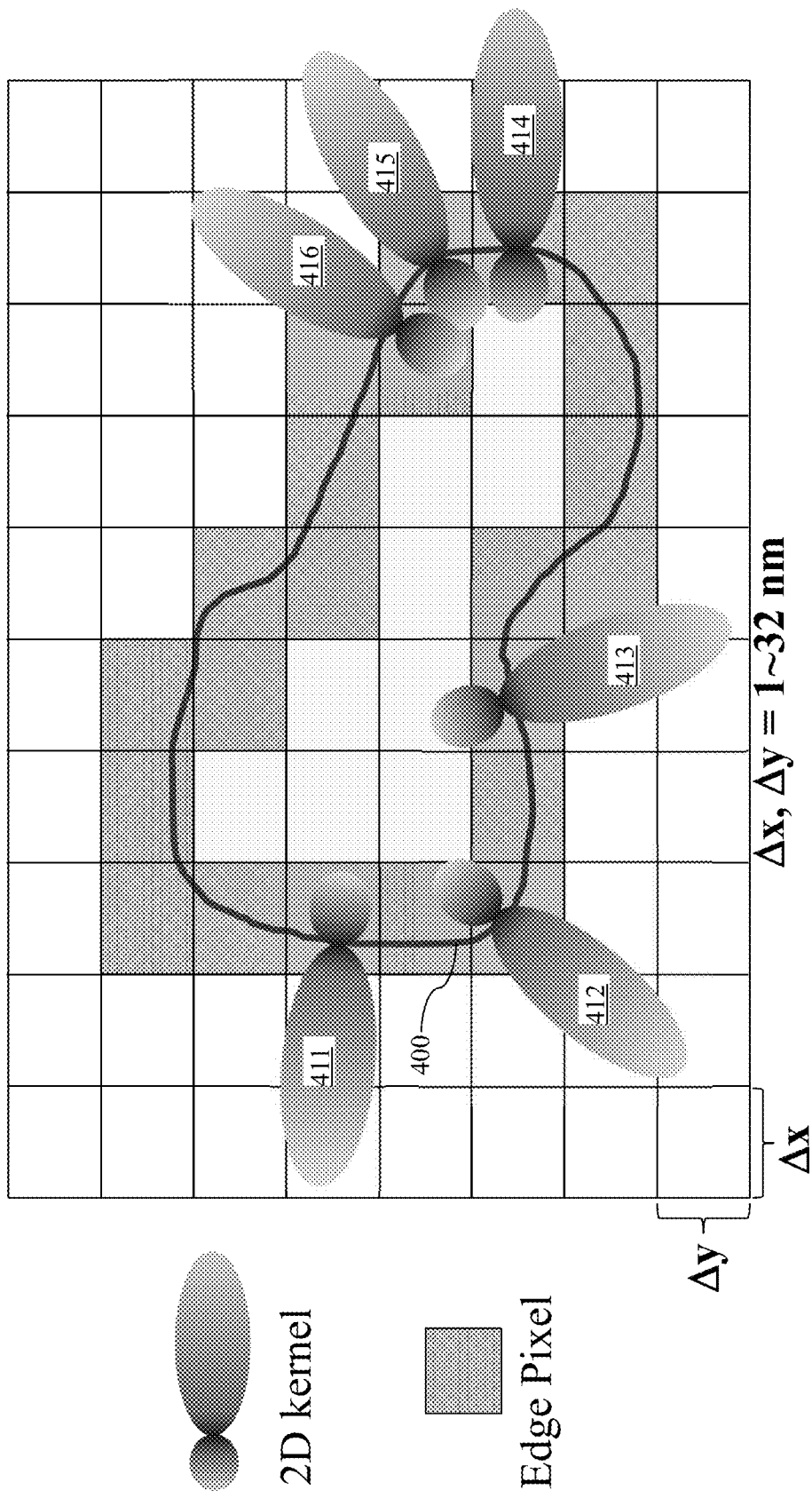
FIG. 5 is a graphical illustration of an example non-Manhattan pattern and a plurality of two-dimensional kernels for that pattern according to various aspects of the present disclosure.

FIG. 5 illustrates two-dimensional kernels 411-416 as examples of the above concept. For example, the two-dimensional kernel 411 has a first orientation angle, the two-dimensional kernel 412 has a second orientation angle, the two-dimensional kernel 413 has a third orientation angle, the two-dimensional kernel 414 has a fourth orientation angle, the two-dimensional kernel 415 has a fifth orientation angle, and the two-dimensional kernel 416 has a sixth orientation angle. The first, second, third, fourth, fifth, and sixth orientation angles are all different from one another.

One of the novel aspects of the present disclosure involves a method to quickly and accurately determine the various rotated two-dimensional kernels that should be applied around the edge of the non-Manhattan pattern 400. This method is graphically illustrated in FIG. 6, which illustrates the decomposition and rotation of the two-dimensional kernels. First, an example two-dimensional kernel 450 is provided. The two-dimensional kernel 450 has not been rotated yet, in other words, it has a 0 degree rotation.

Since the kernel 450 is two-dimensional, it has two degrees of freedom, which in this case can be expressed using polar coordinates. For example, the two-dimensional kernel 450's polar coordinates can be expressed as $f_{2D}(r, \theta)$, where the "2D" signifies that it is two-dimensional in nature, the "r" represents the radius part (also referred to as the radial coordinate) of the polar coordinates, and the "θ" represents the angle part (also referred to as the angular coordinate or pole angle) of the polar coordinates.

Figure 6:
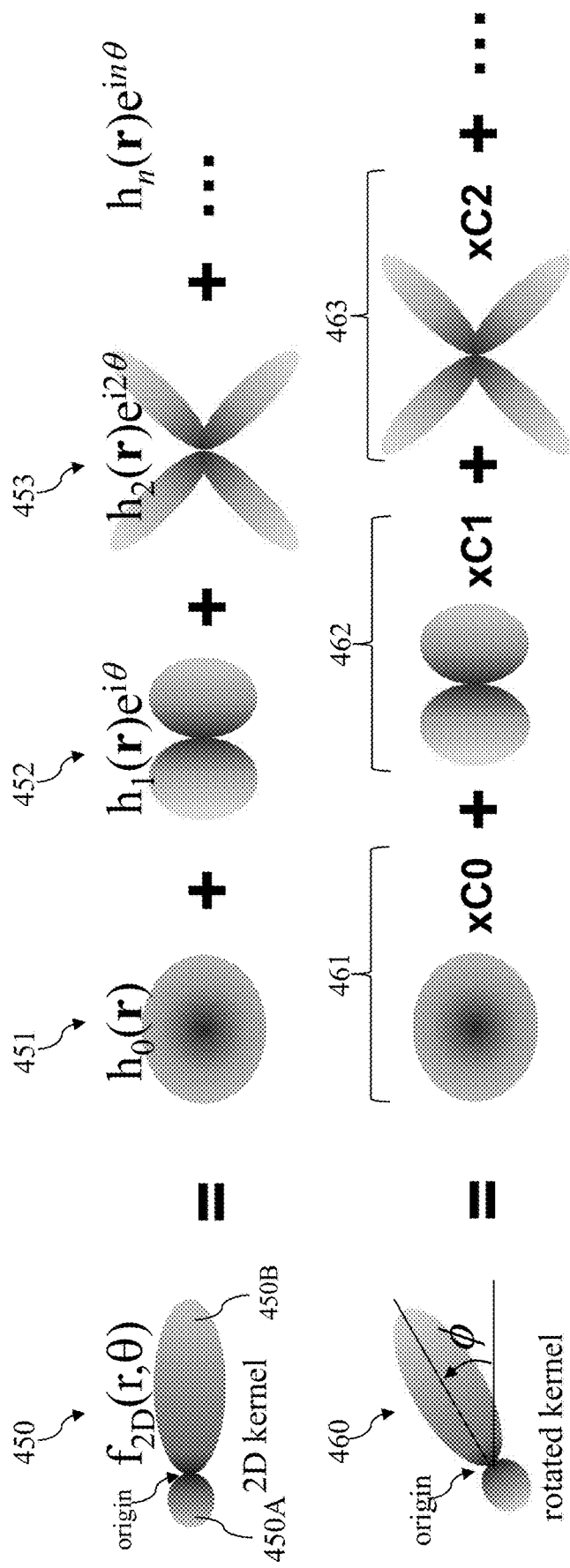
FIG. 6 is a graphical illustration of a decomposition and rotation of the two-dimensional kernels according to various aspects of the present disclosure.

As is shown in FIG. 6, the two-dimensional kernel 450 in this embodiment includes a portion 450A and a portion 450B that is larger than the portion 450A. The portions 450A and 450B are joined together at a point that also corresponds to the origin (i.e., r=0) of the polar coordinate system. In FIG. 5, the two-dimensional kernel intersects with each edge pixel at the kernel origin.

The two-dimensional kernel 450 is decomposed into a plurality of components, some examples of which are shown in FIG. 6 as decomposed components 451, 452, and 453. The decomposed components with different rotational symmetry are expressed in the form of $h_n(r)e^{in\theta}$, where "n" is the sequential number of the decomposed component. Thus, "n" is 0 for the decomposed component 451, "n" is 1 for the decomposed component 452, and "n" is 2 for the decomposed component 453. It is understood that "n" covers all integers (positive, negative and 0) and can vary from −∞ to ∞. "r" and "θ" are the radial and angular coordinates, respectively. "i" is the square root of negative 1.

It is understood that theoretically, the two-dimensional kernel 450 may be decomposed into an infinite number of components. The greater the number of decomposed components, the more accurate the decomposed components will be able to approximate the two-dimensional kernel 450. In reality, however, a few decomposed components is typically enough to provide a sufficiently accurate representation of the two-dimensional kernel 450.

As the two-dimensional kernel 450 is rotated into a two-dimensional kernel 460, which can be decomposed into a plurality of components, some examples of which are shown in FIG. 6 as decomposed components 461, 462, and 463. Again, the two-dimensional kernel 460 may be expressed as an infinite number of decomposed components, but a few decomposed components may be sufficient to approximate the two-dimensional kernel 460 accurately. The decomposed components 461-463 are related to (or are functions of) the decomposed components 451-453, respectively. For example, the decomposed component 461 is the product of the decomposed component 451 and a constant C0, the decomposed component 462 is the product of the decomposed component 452 and a constant C1, and the decomposed component 463 is the product of the decomposed component 453 and a constant C2. In the embodiment shown in FIG. 6, C0=1, C1=exp (−iφ), C2=exp (−i2φ), where "exp(x)" refers to the natural exponential function, i.e., same as ex. In embodiments where the number of decomposed components is n, then the constant Cn may be expressed as exp(−inφ), where "n" is the sequential number of the decomposed component. As discussed above, "n" covers all integers and can vary from −∞ to ∞.

Note that θ and φ represent different things. As discussed above, θ represents the angular coordinate of the two-dimensional kernel, which depends on the location of the two-dimensional kernel in FIG. 5, whereas φ represents the rotation angle (i.e., the orientation angle determined by taking the normal line/vector of each edge pixel) of the two-dimensional kernel in FIG. 5.

It can be seen that since the decomposed components 461-463 can be derived from the decomposed components 451-453 merely by multiplying the decomposed components 451-453 with their respective constants C0, C1, and C2, the rotation of the two-dimensional kernel 450 (into the rotated two-dimensional kernel 460) can be performed more quickly and more accurately than the conventional rotation that transforms the coordinate from (x, y) to (x cos φ+y sin φ, y cos φ−x sin φ).

Figure 7:
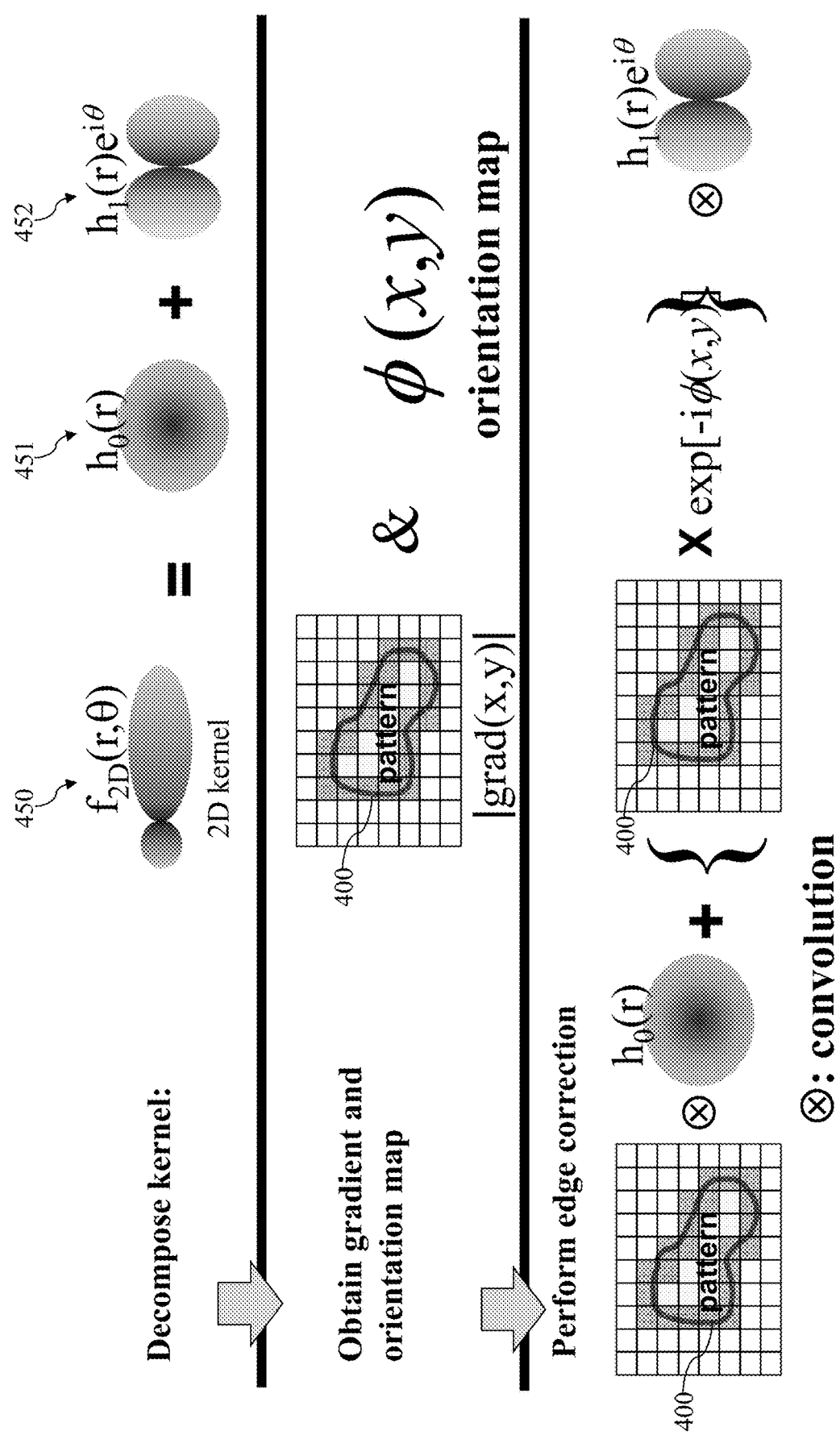
FIG. 7 is a graphical illustration of how to use two-dimensional kernels to perform an edge correction process for a non-Manhattan mask pattern according to various aspects of the present disclosure.

FIG. 7 is a graphical illustration of how to use two-dimensional kernels to perform an edge correction process for the non-Manhattan mask pattern 400 according to an example of the present disclosure. The first step of this process is to decompose the two-dimensional kernel 450. This decomposition process is similar to the one discussed above with reference to FIG. 6. However, rather than decomposing the two-dimensional kernel 450 into three components, the embodiment shown in FIG. 7 decomposes the two-dimensional kernel 450 into two components 451 and 452, where the component 451 is expressed as $h_0(r)$, and the component 452 is expressed as $h_1(r)e^{i\theta}$. Of course, it is understood that the two components 451 and 452 are just an example, and the two-dimensional kernel 450 may be decomposed into any other number of components in alternative embodiments.

The second step of this process shown in FIG. 7 is to obtain the gradient and the orientation map. The gradient of the pattern 400 is obtained as a magnitude and expressed as |grad(x,y)|. The edge pixels may be identified based on the gradient. As discussed above, the orientation map refers to the angle associated with the normal line/vector for each edge pixel. In other words, for each of the edge pixels, the normal line/vector has a corresponding angle or orientation, and the angle/orientation for all the edge pixels collectively may be considered an orientation map. For the sake of simplicity, the orientation map is mathematically expressed herein as φ(x,y). Note that φ(x,y) and φ may be used interchangeably throughout the present disclosure, where φ may be a shorthand notation of φ(x,y).

The third step of this process shown in FIG. 7 is to perform the edge correction process. As a part of the edge correction process, the gradient magnitude |grad(x,y)| is convolved with the decomposed component 451, and the gradient magnitude |grad(x,y)| is also multiplied with exp [−iφ(x,y)] (in other words, multiplied with the constant C1 discussed above with reference to FIG. 6), and then convolved with the decomposed component 452.

The results of the two convolutions are then added together to obtain the edge correction result. The result of the edge correction process represents the correction field (e.g., similar to the correction field 220 shown in FIG. 3, except with two-dimensional kernels rather than one-dimensional kernels) for the non-Manhattan pattern 400. Once the correction field is obtained, the near field (e.g., similar to the true near field 200 shown in FIG. 3, except with a non-Manhattan pattern) of the pattern 400 may be determined by applying the correction field to the thin mask field (e.g., similar to the thin mask field 210 in FIG. 3).

Figure 8:
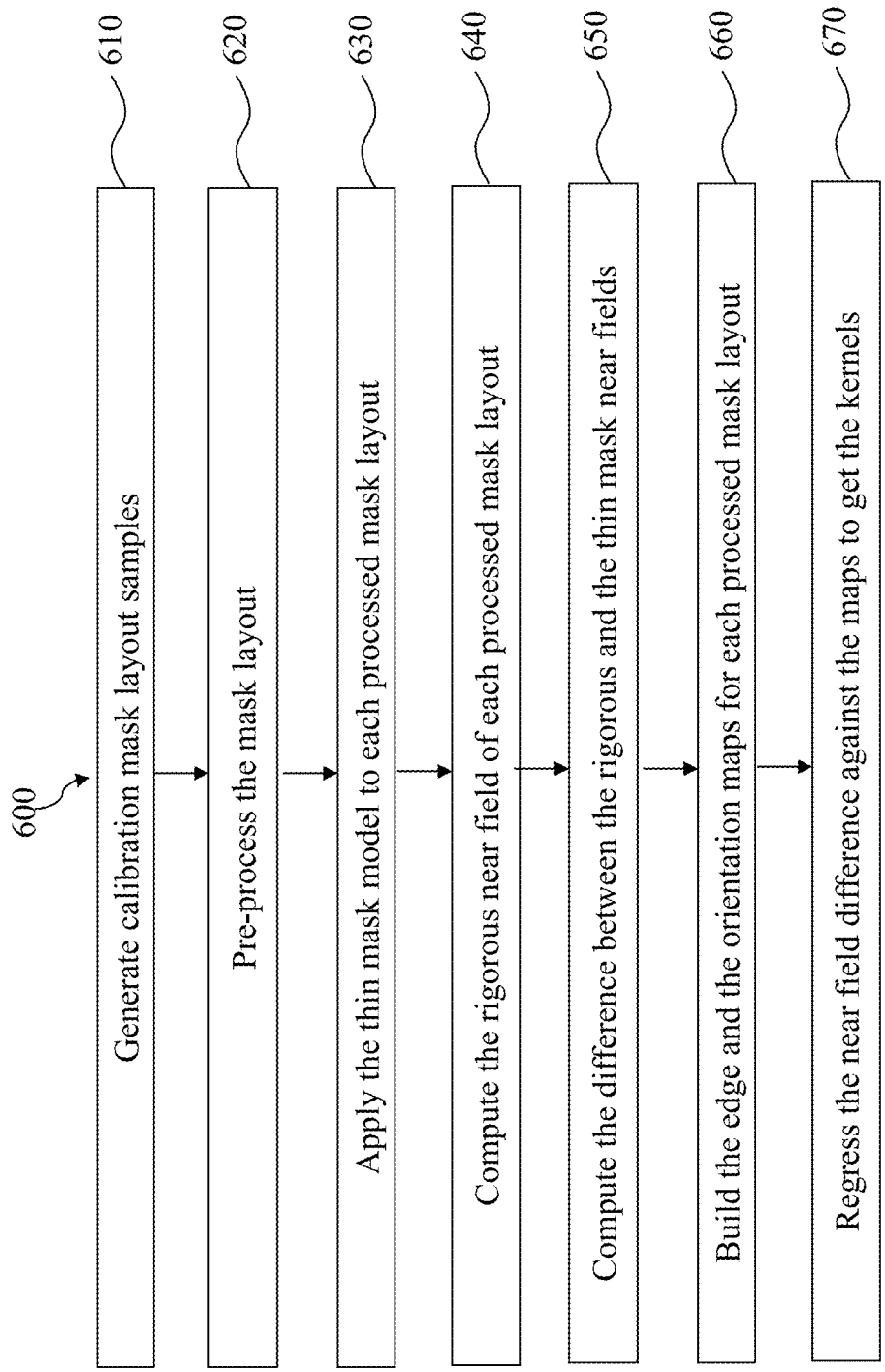
FIG. 8 is a flowchart illustrating a method of preparing the two-dimensional kernels according to various aspects of the present disclosure.

FIG. 8 is a flowchart illustrating a method 600 of preparing the two-dimensional kernels discussed herein. The method 600 includes a step 610, in which calibration mask layout pattern samples are generated. In some embodiments, there may be hundreds of calibration mask layout patterns.

The method 600 includes a step 620, in which the mask layout undergoes preprocessing, for example rasterization and anti-aliasing filtering.

The method 600 includes a step 630, in which the thin mask model is applied to each of the mask patterns processed in step 620.

The method 600 includes a step 640, in which the rigorous near field of each processed mask layout is computed. This may be a computationally intensive process and as such may not be suitable in an actual production environment. However, since the method 600 is directed to a calibration environment, the fact that step 640 is computationally intensive is acceptable.

The method 600 includes a step 650, in which the differences between the rigorous near fields (i.e., the results from step 640) and the thin mask near fields (i.e., the results from step 630) are computed. Step 650 yields the target correction fields.

The method 600 includes a step 660, in which the edge distribution and orientation maps are built for each of the processed calibration mask layout patterns. In other words, the processes discussed above with reference to FIG. 5 are repeated herein for each of the calibration patterns.

The method 600 includes a step 670, in which the near field difference against the maps undergoes regression analysis to get the kernels. As a part of the regression analysis, a plurality of coefficients may be solved. The step 670 may produce a library that can be re-used later to generate the two-dimensional kernels. These two-dimensional kernels can be used for different masks too.

Figure 9:
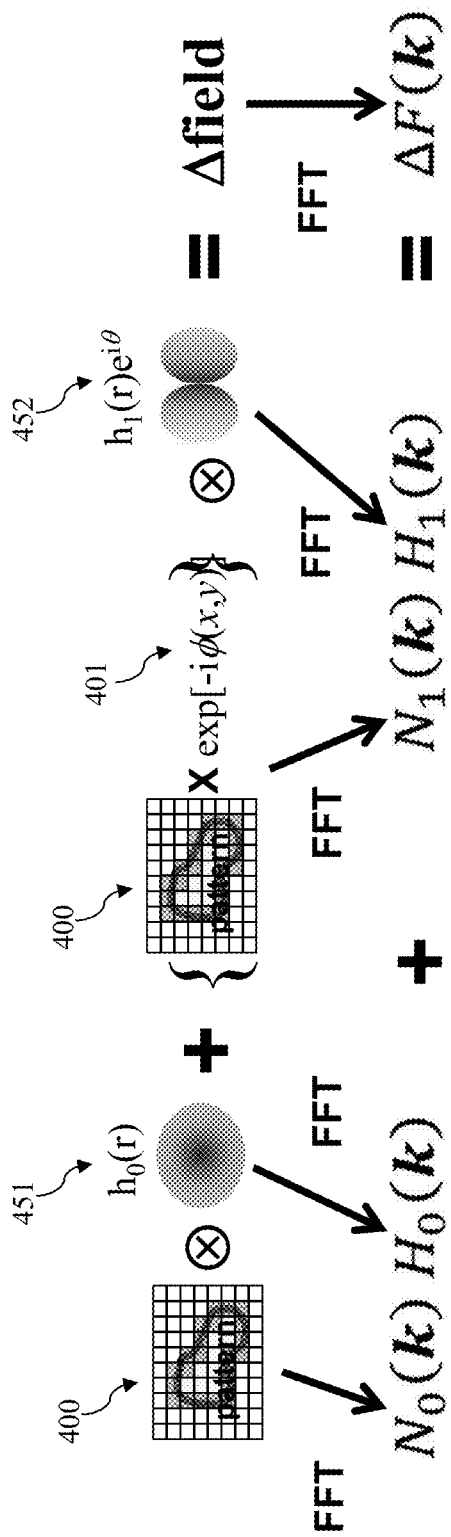
FIG. 9 illustrates a simplified example of how two-dimensional kernels are generated by a regression analysis according to various aspects of the present disclosure.

FIG. 9 illustrates a simplified example of how two-dimensional kernels are generated according to the regression analysis discussed in step 670 above. In FIG. 9, the term "Δfield" represents the results of step 650 of FIG. 8. A Fast Fourier Transform (FFT) is performed to the pattern 400, the product of the pattern 400 and the exponential term 401, and the components 451-452, as shown in FIG. 9. The result is the following equation:

$$N_0(k)H_0(k) + N_1(k)H_1(k) = \Delta F(k)$$

where k is the two-dimensional index in the FFT space $(k=k_1, k_2, \ldots, k_V)$.

If M different samples are generated in step 610, performing FFT on every sample will give M equations. Knowing ΔF(k) from step 650, the following M linear equations are then used to solve for $H_0(k_i)$ and $H_1(k_i)$ by the least square method:

$$N_{01}(k_i)H_0(k_i) + N_{11}(k_i)H_1(k_i) = \Delta F_1(k_i)$$
$$N_{02}(k_i)H_0(k_i) + N_{12}(k_i)H_1(k_i) = \Delta F_2(k_i)$$
$$\vdots$$
$$N_{0M}(k_i)H_0(k_i) + N_{1M}(k_i)H_1(k_i) = \Delta F_M(k_i)$$

The process above will generate a library of two-dimensional kernels including $H_0$ and $H_1$ at every interested $k_i$ that can be reused for many different mask patterns.

Figure 10:
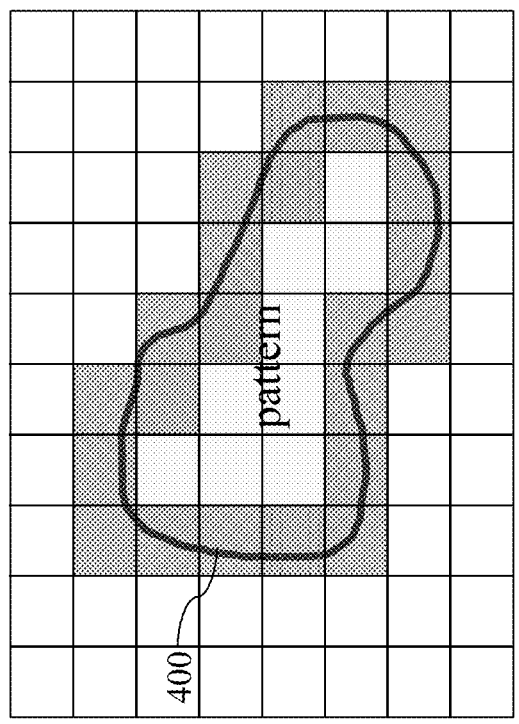
FIG. 10 illustrates the non-Manhattan mask pattern and an aerial image projected by the non-Manhattan pattern on a wafer according to various aspects of the present disclosure.
Figure 10:
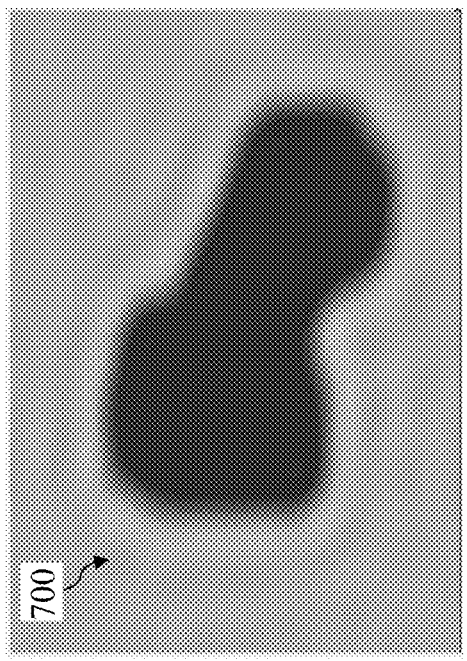

FIG. 10 illustrates the non-Manhattan mask pattern 400 and an aerial image 700 projected by the pattern 400 on a wafer. The aerial image 700 may be viewed as an example of the result of the step 370 of FIG. 4, i.e., by applying an optical model to the near field. Based on FIG. 10, it can be seen that the aerial image 700 closely resembles the original non-Manhattan mask pattern 400, meaning that the methods disclosed herein can achieve sufficient accuracy. For example, because the two-dimensional kernels can have any arbitrary angle/orientation, the aerial image 700 generated by the present disclosure does not have unwanted corners or other spurious features that are associated with other methods. In addition, the present disclosure has a time complexity of $O(N^2 \lg N)$ in the "Big O notation" with the fast rotation method, whereas the conventional methods of direct coordinate rotation may have a time complexity of $O(N^4)$, which is too slow to be applied in OPC or ILT computation. Here "N" refers to the size of one side of the two-dimensional simulation clip. Based on the difference between $O(N^2 \lg N)$ and $O(N^4)$, it can be seen that the methods of the present disclosure can be performed much more quickly in rotating a two-dimensional kernel that will provide much better flexibility and accuracy compared to the one-dimensional kernels employed by the conventional methods.

Figure 11:
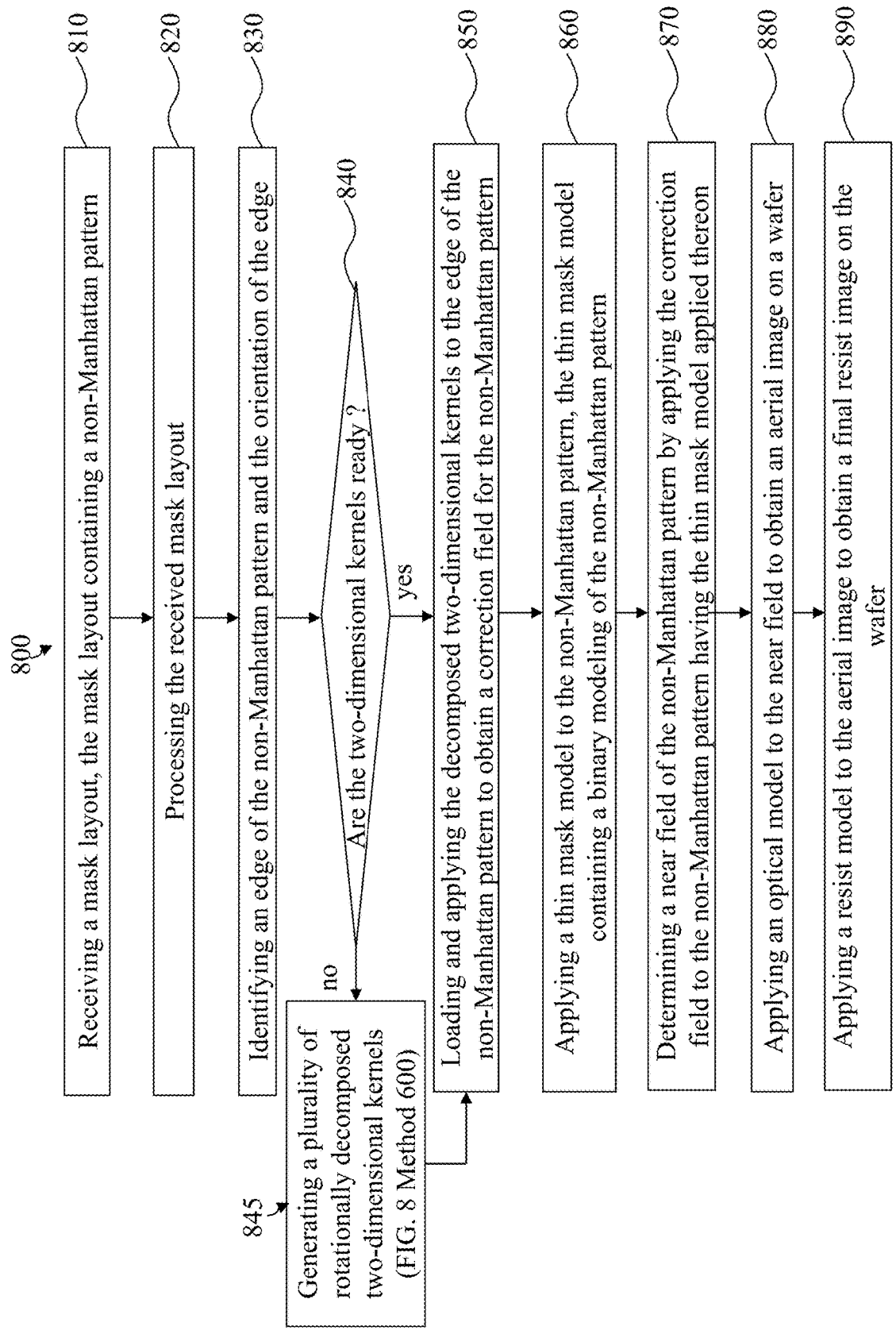
FIG. 11 is a flowchart illustrating a method of modeling a mask according to various aspects of the present disclosure.

FIG. 11 is a flowchart illustrating a method 800 of modeling a mask. The method 800 includes a step 810 of receiving a mask layout, the mask layout containing a non-Manhattan pattern.

The method 800 includes a step 820 of processing the mask layout. In some embodiments, the step 820 involves performing rasterization or anti-aliasing filtering to the received mask layout.

The method 800 includes a step 830 of identifying an edge of the non-Manhattan pattern and the orientation of the edge. In some embodiments, the edge may be identified by taking a gradient of the processed received mask layout.

The method 800 includes a step 840 of checking whether the decomposed two-dimensional kernels have been generated. If not, the decomposed two-dimensional kernels will be generated by a step 845 that calls method 600. The decomposed two-dimensional kernels each have a respective rotational symmetry. In some embodiments, the step 845 involves decomposing each of the two-dimensional kernels into a plurality of components.

The method 800 includes a step 850 of loading and applying the two-dimensional kernels to all the edges of the non-Manhattan pattern to obtain a correction field for the non-Manhattan pattern.

The method 800 includes a step 860 of applying a thin mask model to the non-Manhattan pattern. The thin mask model contains a binary modeling of the non-Manhattan pattern.

The method 800 includes a step 870 of determining a near field of the non-Manhattan pattern by applying the correction field to the non-Manhattan pattern having the thin mask model applied thereon.

The method 800 includes a step 880 of applying an optical model to the near field to obtain an aerial image on a wafer.

The method 800 includes a step 890 of applying a resist model to the aerial image to obtain a final resist image on the wafer.

It is understood that although the method 800 is performed to a mask layout having a non-Manhattan pattern as an example, the method 800 may be applied to mask layouts having Manhattan patterns too. In addition, additional steps may be performed before, during, or after the steps 810-890 herein. For example, the additional steps may include manufacturing a mask, and/or performing semiconductor fabrication using the mask. For reasons of simplicity, these additional steps are not discussed in detail herein.

One aspect of the present disclosure involves a method. A mask layout is received. A set of two-dimensional kernels is generated based on a set of pre-selected mask layout samples. The set of two-dimensional kernels is applied to the received mask layout to obtain a correction field. A near field of the received mask layout is determined based at least in part on the correction field.

Another aspect of the present disclosure involves a method. A mask layout is received. The received mask layout contains a non-Manhattan pattern. A plurality of two-dimensional kernels is generated based on a set of pre-selected mask layout samples. The two-dimensional kernels each have a respective rotational symmetry. The two-dimensional kernels are applied to all the edges of the non-Manhattan pattern to obtain a correction field for the non-Manhattan pattern. A near field of the non-Manhattan pattern is determined based at least in part on the correction field.

Yet another aspect of the present disclosure involves a method. A mask layout that contains a non-Manhattan pattern is received. The received mask layout is processed. An edge of the non-Manhattan pattern and the orientation are identified. A plurality of two-dimensional kernels is generated based on a set of processed pre-selected mask layout samples. The two-dimensional kernels each have a respective rotational symmetry. The two-dimensional kernels are applied to all the edges of the non-Manhattan pattern to obtain a correction field for the non-Manhattan pattern. A thin mask model is applied to the non-Manhattan pattern. The thin mask model contains a binary modeling of the non-Manhattan pattern. A near field of the non-Manhattan pattern is determined by applying the correction field to the non-Manhattan pattern having the thin mask model applied thereon. An optical model is applied to the near field to obtain an aerial image on a wafer. A resist model is applied to the aerial image to obtain a final resist image on the wafer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a mask layout that contains a layout pattern;
   identifying a plurality of edge pixels of the layout pattern, the edge pixels each containing an edge segment of the layout pattern, respectively;
   determining an orientation angle of the edge segment in each of the edge pixels, respectively;
   generating a rotated multi-dimensional kernel for each of the edge segments, respectively, wherein each rotated multi-dimensional kernel is generated based at least in part on the orientation angle of the respective edge segment, and wherein at least some of the multi-dimensional kernels are rotated differently from one another along an edge of the layout pattern;
   applying a mask model to the mask layout;
   determining a near field by combining a result of the applying the mask model and an edge correction process; and
   fabricating an integrated circuit (IC) device at least in part based on the near field.

2. The method of claim 1, wherein the layout pattern includes a non-Manhattan pattern.

3. The method of claim 1, wherein the identifying the edge pixels includes taking a gradient magnitude of the layout pattern.

4. The method of claim 1, wherein the rotated multi-dimensional kernel is generated to include two dimensions.

5. The method of claim 1, wherein the generating the rotated multi-dimensional kernel includes:
providing an unrotated multi-dimensional kernel having a 0 degree rotation, the unrotated multi-dimensional kernel including at least a first portion and a second portion joined together at a kernel origin;
decomposing the unrotated multi-dimensional kernel into a plurality of first components;
calculating a plurality of second components at least in part by multiplying each of the first components with a different constant, respectively; and
combining the second components to generate the rotated multi-dimensional kernel.

6. The method of claim 5, wherein for each rotated multi-dimensional kernel, the kernel origin intersects with the edge segment for which it is generated.

7. The method of claim 5, wherein the first components have different rotation symmetries expressed as $h_n(r)e^{in\theta}$, and wherein:
"n" represents a sequential number of the first components;
"r" represents a radial coordinate;
"θ" represents an angular coordinate; and
"i" represents a square root of negative 1.

8. The method of claim 5, wherein the constant includes a natural exponential function of the orientation angle.

9. The method of claim 1, further comprising: applying the rotated multi-dimensional kernel to each of the edge segments, respectively.

10. The method of claim 9, wherein the edge correction process is performed using the rotated multi-dimensional kernel, thereby obtaining a correction field of the layout pattern.

11. The method of claim 10, wherein the edge correction process includes performing one or more convolution processes involving the rotated multi-dimensional kernel.

12. The method of claim 10, wherein the determining the near field of the layout pattern further comprises applying the correction field to a thin mask field of the layout pattern, wherein the thin mask field has non-blurry edges.

13. The method of claim 12, further comprising:
applying an optical model to the near field to obtain an aerial image on a wafer; and
applying a resist model to the aerial image to obtain a final resist image on the wafer.

14. A method, comprising:
receiving a mask layout that contains a layout pattern;
identifying a plurality of edge pixels of the layout pattern, the edge pixels each containing an edge segment of the layout pattern, respectively;
determining an orientation angle of the edge segment in each of the edge pixels, respectively; and
generating a rotated multi-dimensional kernel for each of the edge segments, respectively, wherein the generating includes:
providing an unrotated multi-dimensional kernel;
decomposing the unrotated multi-dimensional kernel into a plurality of first components;
calculating a plurality of second components at least in part by multiplying each of the first components with a different constant, respectively; and
combining the second components to generate the rotated multi-dimensional kernel.

15. The method of claim 14, wherein the layout pattern includes non-straight edges, and wherein the identifying is performed at least in part by taking a gradient magnitude of the layout pattern.

16. The method of claim 14, wherein the multi-dimensional kernel includes a two-dimensional kernel, and wherein the different constant includes a natural exponential function of the orientation angle.

17. The method of claim 14, further comprising: applying, via an edge correction process, the rotated multi-dimensional kernel to each of the edge segments, respectively.

18. The method of claim 17, wherein the edge correction process is performed at least in part via one or more convolution processes involving the rotated multi-dimensional kernel.

19. A method, comprising:
receiving a mask layout that contains a layout pattern;
identifying a plurality of edge pixels of the layout pattern at least in part by taking a gradient magnitude of the layout pattern, the edge pixels each containing an edge segment of the layout pattern, respectively;
determining an orientation angle of the edge segment in each of the edge pixels, respectively;
generating a rotated multi-dimensional kernel for each of the edge segments, respectively, wherein each rotated multi-dimensional kernel is generated based at least in part on the orientation angle of the respective edge segment, and wherein at least some of the multi-dimensional kernels are rotated differently from one another along an edge of the layout pattern;
applying a mask model to the mask layout;
determining a near field by combining a result of the applying the mask model and an edge correction process; and
fabricating an integrated circuit (IC) device at least in part based on the near field.

20. The method of claim 19, further comprising:
applying the rotated multi-dimensional kernel to each of the edge segments, respectively, including performing the edge correction process using the rotated multi-dimensional kernel;
obtaining a correction field of the layout pattern based on the applying;
determining a near field of the layout pattern at least in part by applying the correction field to a thin mask field of the layout pattern, wherein the thin mask field has non-blurry edges;
generating an aerial image on a wafer at least in part by applying an optical model to the near field; and
generating a final resist image on the wafer at least in part by applying a resist model to the aerial image.

* * * * *